United States Patent [19]

Marquis et al.

[11] Patent Number: 5,767,715
[45] Date of Patent: Jun. 16, 1998

[54] METHOD AND APPARATUS FOR GENERATING TIMING PULSES ACCURATELY SKEWED RELATIVE TO CLOCK

[75] Inventors: Steven R. Marquis, Fall City; Scott T. Hoffman, Issaquah, both of Wash.

[73] Assignee: Siemens Medical Systems, Inc., Iselin, N.J.

[21] Appl. No.: 536,599

[22] Filed: Sep. 29, 1995

[51] Int. Cl.[6] .............................. H03K 5/135; G11C 8/04
[52] U.S. Cl. .................. 327/159; 327/158; 327/233; 326/93; 365/233
[58] Field of Search ........................ 327/155, 156, 327/158, 159, 141, 146, 147, 150, 291, 292, 105, 107, 233, 262, 161; 326/93; 365/233

[56] References Cited

U.S. PATENT DOCUMENTS 5,517,147  5/1996  Burroughs et al. ................ 327/295
5,578,945  11/1996  Flora ................................. 327/156

OTHER PUBLICATIONS

F. Lee and P. Pun, Application Note (Preliminary) Phase-Locked Loops, LSI Logic, Sep. 20, 1990, pp. 1–17.
"0.5 µm Technology PLL Phase-Locked Loop Macrofunction Family," Oki Semiconductor Data Sheet, Oct. 1994, pp. 1–13.

Johnson et al., "A Variable Delay Line PLL for CPU-Coprocessor Synchronization;" IEEE Journal of Solid-State Circuits, vol. Synchronization; IEEE Journal of Solid-State Circuits, vol. 23, No. 5, Oct. 1988.

Primary Examiner—Timothy P. Callahan
Assistant Examiner—Terry L. Englund

[57] ABSTRACT

The timing signal output from a subject circuit is accurately skewed relative to a base clock signal period. A phase-locked loop ("PLL") and sample delay circuit are implemented with the subject circuit. The PLL receives the base clock signal and generates a local clock signal. The local clock signal is input to a sample delay circuit and the subject circuit. The sample circuit generates a delay approximating that of the subject circuit. The output of the sample delay circuit is fed back into the PLL. With the base clock as the PLL's reference signal and the delayed signal as the feedback signal, the local clock signal phase is forced to precede the base clock phase by the propagation delay of the sample delay circuit. In effect, the propagation delay is nulled out. For a PLL generating multiple output phases a zero phase goes to the sample delay circuit and an output with a phase corresponding to a desired skew goes to the subject circuit. Also, a class of logic devices is defined in which propagation delays are nulled out.

5 Claims, 4 Drawing Sheets

METHOD AND APPARATUS FOR GENERATING TIMING PULSES ACCURATELY SKEWED RELATIVE TO CLOCK

BACKGROUND OF THE INVENTION

1. Field of the Invention

This invention relates generally to methods and apparatus for generating accurately positioned timing pulses within a clock period.

2. Description of the Related Art

In many applications it is desirable to accurately position a pulse relative to a system clock. For example, in memory applications, it is desirable to position a write pulse of a given width and skew within a single clock period. To assure such placement conventional methods include the use of delay lines and/or clock doublers. Dynamic random access memory (DRAM), for example, includes timing generators which often use delay lines to position critical timing strobe signals. Signals derived from a doubled clock or skewed through a delay line serve to provide a relative latency to place a desired pulse within the period of the base clock signal. Clock doubler circuits can create pulses which fall on boundaries other than those of the base clocks. This is acceptable if the timing requirements allow a few fixed edge placement possibilities and if skew control requirements are not stringent. Delay lines typically have poor initial accuracy and vary with voltage and temperature.

As clock frequencies, increase, the ability to rely on clock doublers or delay lines diminishes. Specifically, as the clock frequencies used in circuits increase, there is less clock period cushion for circuit propagation delay times. The propagation delays become a significant portion of the clock period, making synchronous design more difficult. Further, the skew of signals occurring within the clock period becomes more uncertain. Any digital delay or logic device introduced into the signal path, for the purpose of wave shaping or delay adds a non-deterministic variance to the propagation delay. Such variance makes it difficult to design and implement high frequency synchronous circuits.

Accordingly, there is a need for a method and apparatus for accurately placing timing pulses within a clock period, especially for circuits operated under increasingly fast clock frequencies.

SUMMARY OF THE INVENTION

According to the invention, a subject circuit's propagation delays are offset using a phase-locked loop. For example, a given subject circuit is to generate a timing pulse accurately skewed within a base clock signal's period. Such timing pulse is accurately skewed by factoring out the subject circuit's propagation delay. This is done by providing the subject circuit with a local clock active edge that occurs earlier than the active edge of a base clock. Specifically, it occurs earlier by an amount approximating the propagation delay of the subject circuit.

According to one aspect of the invention, a modeled delay time matching the subject circuit's propagation delay is used to define the interval by which the local clock's active edge precedes the base clock's active edge.

According to another aspect of the invention, a phase-locked loop ("PLL") and sample delay circuit are implemented with the subject circuit. The PLL receives the base clock signal and generates a local clock signal. The local clock signal is input to the sample delay circuit and the subject circuit. The output of the sample delay circuit is fed back into the PLL. With the base clock as the PLL's reference signal and the delayed signal as the feedback signal, the local clock signal phase is forced to precede the base clock phase by the propagation delay of the sample delay circuit.

According to another aspect of the invention, the PLL generates multiple phased outputs of the local clock signal. The zero-phase output is input to the sample delay circuit, while the same or another phased output is input to the operational logic. The phase difference, if any, between the zero-phase output and the phase of the output received at the subject circuit defines the skew of the operational circuit's output pulse relative to the base clock. Thus, an accurately skewed timing pulse is generated within the base clock signal period. Such skew is prescribed or programmed.

According to another aspect of the invention, a class of logic devices is defined in which propagation delays are eliminated. More specifically, the propagation delays are nulled out. Any digital circuit is equivalently represented as one or more unit links, in which a unit link is formed by combinatorial logic and a register. Input signal(s) are received by the combinatorial logic resulting in an output set into the register. The register in turn is clocked to generate an output signal. The unit link or a group of unit links is redefined according to this invention by including a PLL and a sample delay circuit. The sample delay circuit generates a signal delay approximating that of the unit link(s) output register. Such delay is nulled out by the PLL. The PLL generates a phase-shifted local clock signal to the unit link(s). Thus, the unit link(s)'s output is accurately skewed relative to a base clock signal. Such skew is of a prescribed or programmed amount, (e.g., zero degrees or more).

The advantage of the invention is that timing pulses can be accurately placed within a base clock signal period. A beneficial effect is that timing synchronization is achieved for increasingly fast circuits in which typical propagation delays otherwise account for a significant portion of the clock period.

DETAILED DESCRIPTION

Output Signal with Defined Skew

Figure 1:
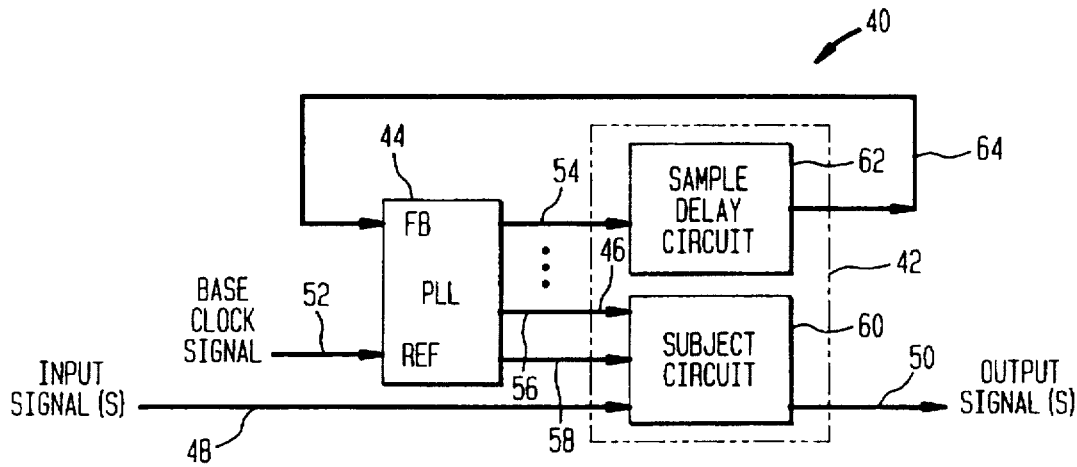
FIG. 1 is a block diagram of an apparatus for accurately placing a timing signal relative to a base clock signal according to an embodiment of this invention.

FIG. 1 shows a digital logic apparatus 40 with an accurately skewed output signal according to an embodiment of this invention. The apparatus 40 includes a logic circuit 42 and a phase-locked loop circuit (PLL) 44. The logic circuit 42 is any digital logic circuit (i) which receives a clock signal 46 and an input signal 48, and (ii) generates in response an output signal 50. In various embodiments the logic circuit 42 is a programmable logic array, memory circuit, processor circuit, buffer circuit, logic gate, or any other combinational or arbitrary logic circuit.

The PLL 44 receives a base clock signal 52 and locks the skew of the logic circuit output signal 50 to a prescribed phase of the base clock signal 52. The PLL 44 and logic circuit 42 are coupled and define a feedback path. The PLL 44 receives the base clock signal 52 and generates in response one or more phased outputs 54-58. One or more of the phased outputs 54-58 are received by the logic circuit 42. The logic circuit 42 includes a subject circuit 60 and a sample delay circuit 62. A phased output signal 56 received from PLL 44 serves as a local clock signal 46 for the subject circuit 60. Local clock signal 46 clocks the subject circuit 60 to generate output signal(s) 50 responsive to the input signal(s) 48.

A feedback path between the logic circuit 42 and PLL 44 is defined to accurately control the skew of the output signal 50 relative to the base clock signal 52. Specifically, the phased output signal 54 or another of the phased output signals 56, 58 is received at the logic circuit 42's sample delay circuit 62. The sample delay circuit 62 responds to the received signal 54 (56,58) by introducing a delay modeled to approximate the subject circuit 60's delay. As a result, the sample delay circuit 62 generates a sample delay output signal 64. Such signal 64 is fed back into the PLL 44. The PLL 44 then forces the zero-phase output line (e.g., one of phased outputs 54-58) to line up to the phase of the feedback signal (i.e., the sample delay circuit's output signal 64). The other phase output signals 54-58 line up according to their prescribed phase offsets.

Figure 2:
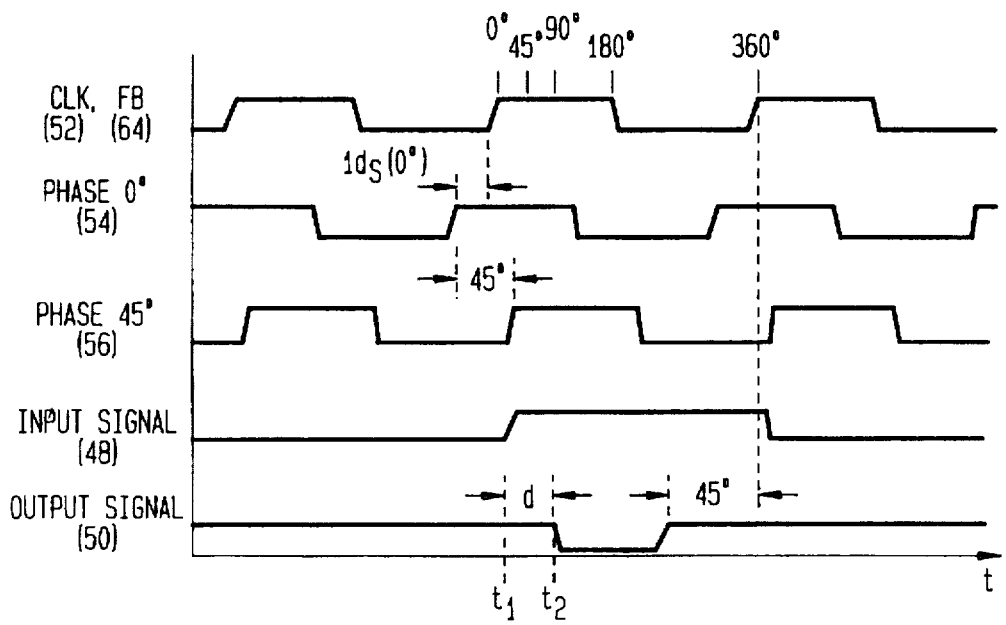
FIG. 2 is a timing diagram for the apparatus of FIG. 1.

FIG. 2 shows a timing diagram of the digital logic apparatus 40 for the case in which (i) the sample delay circuit 62 receive a zero-phase output signal 54 from the PLL 44, and (ii) the subject circuit 60 receives a 45°—phase output signal 56 as a local clock signal 46 from the PLL 44. For a subject circuit logic 60 which introduces a propagation delay d, the sample delay circuit 62 introduces a corresponding delay $d_s$, where $d_s$ approximates d. The PLL forces the base clock signal 52 and feedback signal 64 to be phase-aligned. Thus, the PLL 44 forces the zero degree phase output 54 to have an active edge at a time interval $d_s$ before the feedback signal 64. The 45 degree phase output signal 56 occurs 45 degrees after the zero phase output signal 54. The subject circuit 60 receives the 45 degree phase output signal 54 as its local clock signal 46. Input signal 48 goes active during the clock period of base clock signal 52. Once the local clock signal 46 goes active, the output signal 50 goes active an interval 'd' later. Thus, the subject circuit's propagation delay is nulled out, and the output signal 50 is locked in at a 45 degree skew relative to the base clock signal 52. Alternate skews for the output signal 50 are achieved by using alternate phase output signals 54-58 from the PLL 44. The zero degree phase output signal 54 results in an output signal aligned with the base clock signal 52. The desired skew is achieved by selecting a corresponding skew output from the PLL 44.

Zero-Delay Synchronous Logic Device

Figure 3:
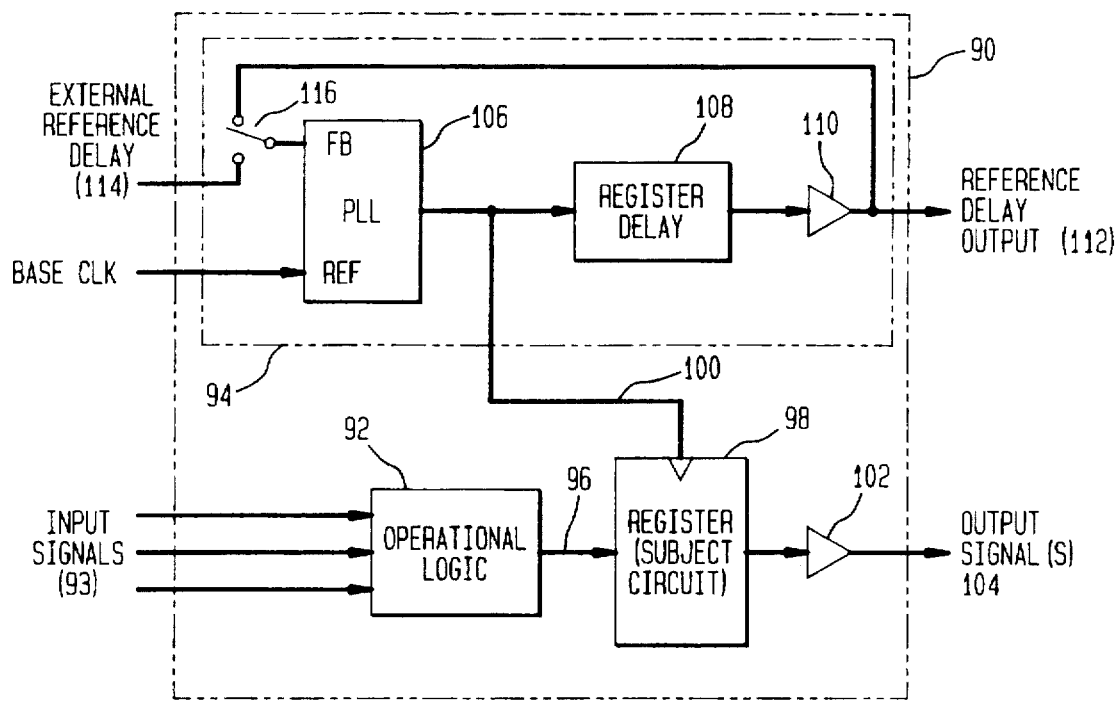
FIG. 3 is a block diagram of a logic device incorporating an apparatus for accurately placing a timing signal relative to a base clock signal according to another embodiment of this invention.

By incorporating the controlled output signal skewing methodology into a logic device, a class of prescribed-delay synchronous logic devices is achieved. According to various specific embodiments, such logic devices serve as a programmable logic array, memory circuit, processor circuit, buffer circuit, logic gate, or any other combinational or arbitrary logic circuit. In a preferred embodiment a zero-delay synchronous logic device 90 is achieved. As shown in FIG. 3, the logic device 90 includes an operational logic circuit 92 with a registered output and a synchronization circuit 94. The operational logic circuit 92 receives one or more input signals 93 and in response generates an output 96. The output is fed to a register 98. The register 98 receives a resident internal clock signal 100 (i.e., local clock signal) which synchronizes the output 96. Specifically, the output 96 is fed through register 98 to an output buffer 102 resulting in an output signal 104 synchronized to a base clock signal, CLK. Thus, the register 98 and buffer 102 together correspond to the subject circuit 60 of FIG. 1.

The synchronization circuit 94 includes a phase-locked loop (PLL) 106, delay circuit 108 and a buffer circuit 110. The delay circuit 108 and buffer 110 together define the sample delay circuit 62 of FIG. 1. The PLL 106 receives the base clock signal CLK and generates the resident clock signal 100. The delay circuit 108 is modeled to generate a delay approximating the delay of register 98. The buffer circuit 110 generates a delay approximating the delay of the output buffer 102. A reference delay output signal 112 is output from buffer circuit 110 and fed back to the PLL 106. The PLL 106 locks the resident clock signal 100 phase to the fed-back delay signal 112. Because the delay matches the delay of the register 98 and output buffer 110, the device 90 output signal 104 is synchronized at a zero-phase delay relative to the base clock signal CLK. Thus, output signal 104 delay is reduced by the same amount as the increase in input signal 93 set-up time caused by register 98 and buffer 102.

Figure 4:
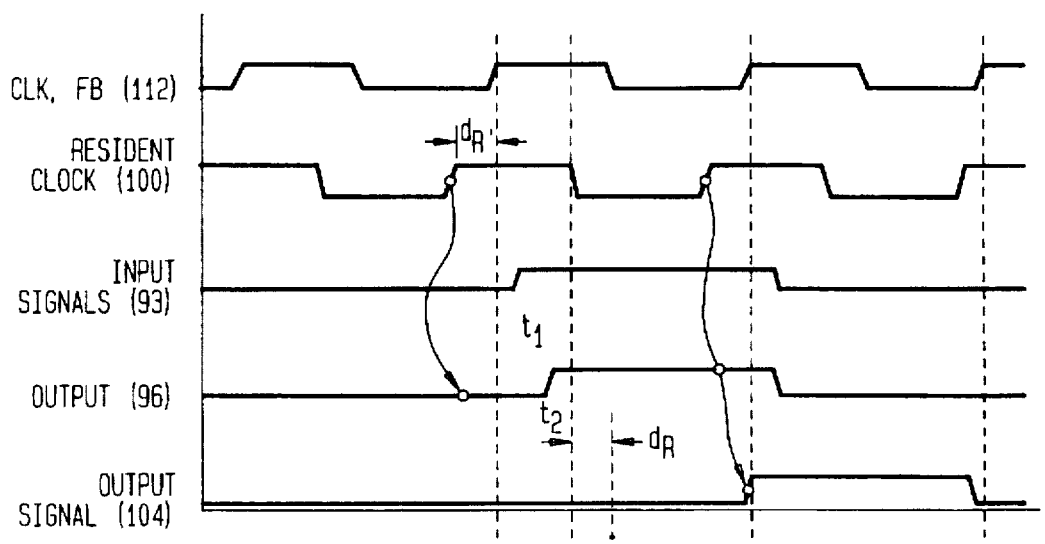
FIG. 4 is a timing diagram for the apparatus of FIG. 3.

FIG. 4 shows a timing diagram for the signals occurring in circuit 90. Register 98 and output buffer 102 together introduce a delay interval $d_R$ relative to the internal clock signal 100. The register delay 108 and buffer delay 110 introduce a sample delay interval $d_{R'}$, approximating the delay $d_R$. The PLL 106 forces the base clock signal CLK and feedback signal 112 to be phase-aligned. Thus, the PLL output signal, which serves as the resident clock signal 100 is skewed by the delay interval $d_{R'}$. The operational logic 92 receives input signal 93 as some time t1. In response the operational logic generates an output 96 at some delayed time thereafter t2. The output 96 is input to the register 98 which is clocked by resident clock signal 100. Once the resident clock signal 100 is asserted high, the output signal 104 is asserted an interval $d_R$ later. Thus, the output signal 104 is locked in at a zero degree skew relative to the external clock signal CLK. In other embodiments, alternate skews for the output signal 104 are achieved by using alternate phase output signals from the PLL 106 as the resident clock signal 100.

Referring again to FIG. 3, in alternative embodiments an external reference delay 114 is input to PLL 106, instead of feeding back the buffer 110 output. In such instances, the output signal 104 is synchronized relative to the external delay 114. For example, in one embodiment there are multiple circuits 90, each one synchronized at a prescribed phase relative to one common external reference signal 114. A switch 116 defines whether the delay 114 or buffer 110 output is input to the PLL 106.

RAM Write Pulse Skewed Relative to RAM Address Signal

Figure 5:
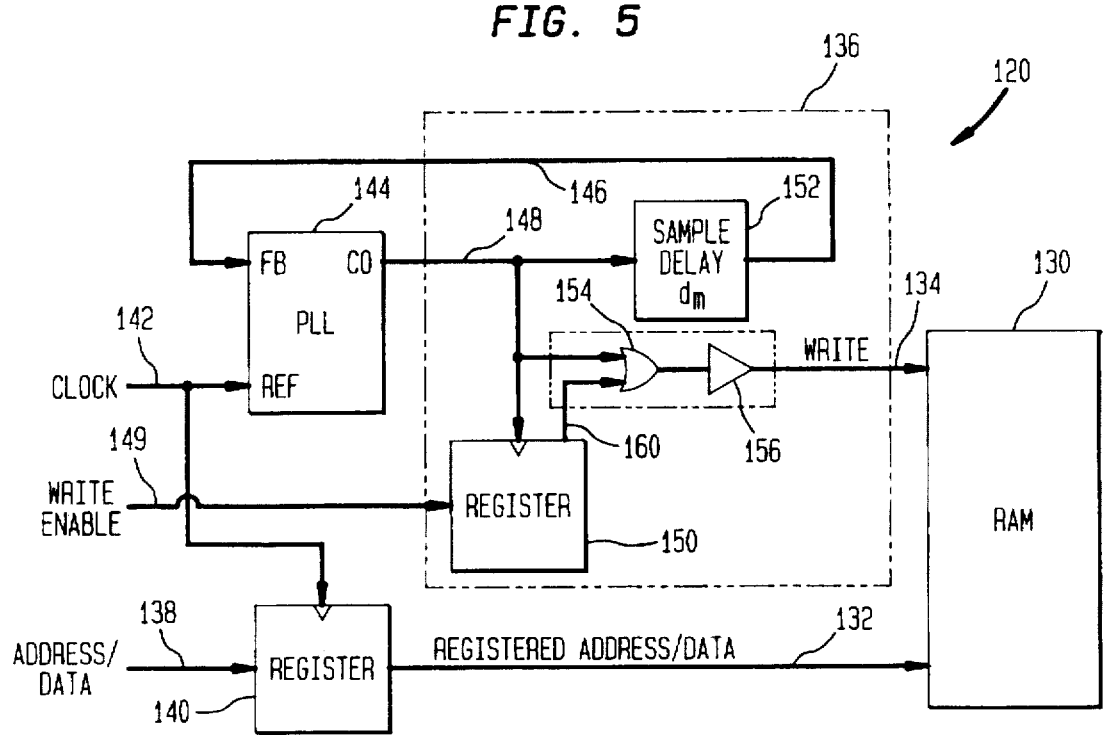
FIG. 5 is a write pulse generation circuit according to an embodiment of this invention.

FIG. 5 shows a circuit 120 for skewing a sub-clock cycle write pulse relative to a corresponding address/data signal. For example, it is desirable to position a write pulse input to random access memory (RAM) relative to a corresponding address/data signal input. The write pulse is to have an adequate setup and hold time relative to the address/data signal. Varying circuit delays, however, make it difficult to accurately and reliably position the write pulse. FIG. 5 shows a RAM 130 receiving a registered address/data signal 132 and the skewed write pulse 134. A PLL 144 and programmed logic array 136 accurately position the write pulse 134.

An address/data signal 138 is input to a register 140. The register 140 is clocked by a base clock signal 142 resulting in a registered address/data signal 132. The registered address/data signal 132, therefore, is synchronized relative to the base clock signal 142. The base clock signal 142 also serves as the reference input to a phase-locked loop circuit 144. The PLL 144 also receives a feedback signal 146. The PLL 144 forces the feedback signal 144 into synchronization with the base clock signal 142.

A write enable signal 149 is input to a register 150. The register 150 is clocked by the output signal 148 of PLL 144 generating a write enable registered signal 160. The write enable registered signal 160 is input to an OR gate 154. The OR gate also receives the PLL output signal 148. The output of the OR gate is buffered at buffer 156 then output to the RAM 130 as the write pulse signal 134.

The PLL 144 output signal 148 also is input to a delay circuit 152. The delay circuit 152 generates a delay, $d_m$, which approximates the delay of the OR gate 154 ($d_{or}$) plus the delay of the buffer 156 ($d_b$); (i.e., $d_m \approx d_{or} + d_b$).

The function of circuit 120 is to generate a write pulse 134 having a width less than the period of clock signal 142. In the embodiment shown, a 5 nano-second (ns) pulse is placed between rising edges of the clock signal 142, which has a period of 10 ns. The write pulse is generated using a PAL circuit 136 which has an internal delay varying from 1 ns to 5 ns. Regardless of the actual delay, the write pulse 134 is skewed at a known phase relative to the clock signal 142. For the embodiment shown the skew is zero degrees. By synchronizing the write pulse 134 to the clock signal 142, the write pulse has an adequate setup and hold time relative to a corresponding address/data signal 138.

Figure 6:
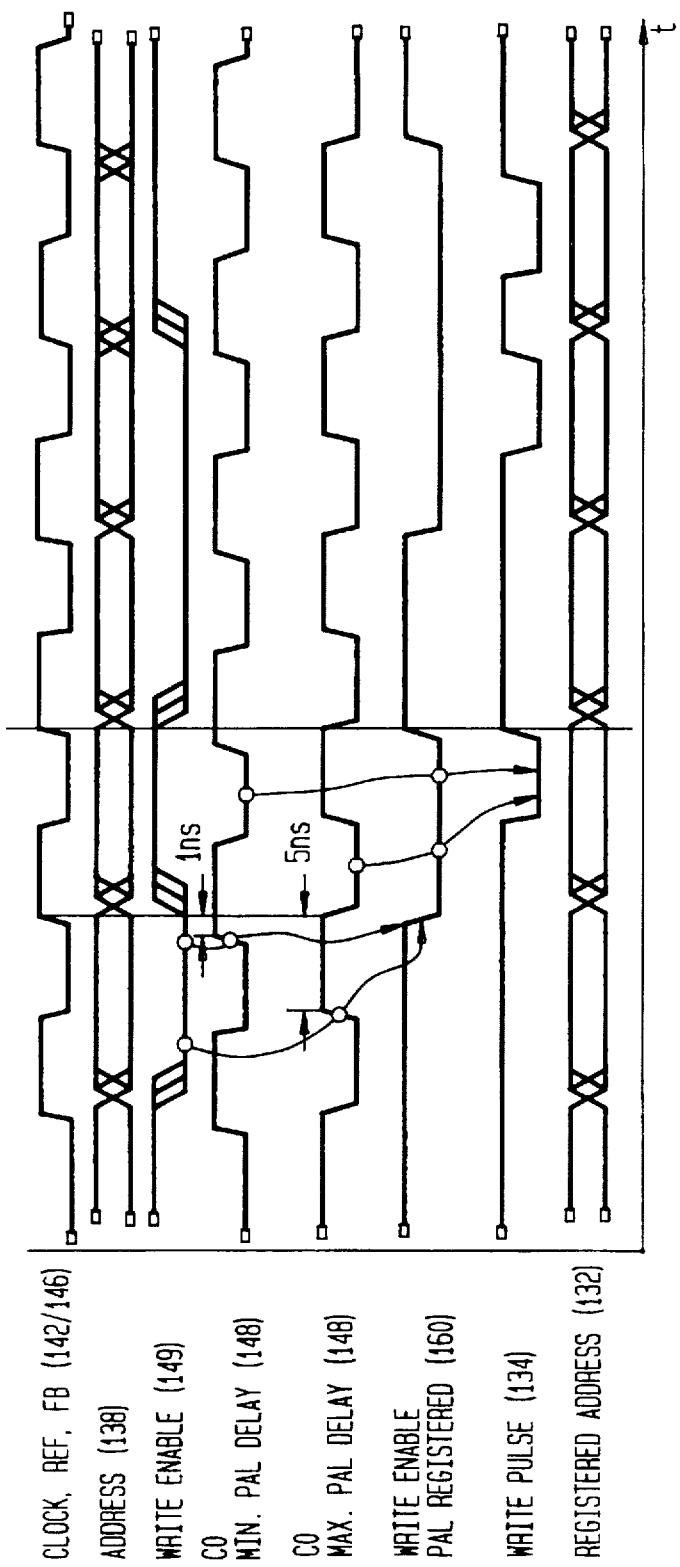
FIG. 6 is a timing diagram for the apparatus of FIG. 5.

FIG. 6 shows a timing diagram for the circuit 120. As shown the PLL 144 forces the PLL output signal (co) 148 to occur at a PAL delay interval (e.g., 1 ns–5 ns) before the rising edge of the clock signal 142. Thus, regardless of the actual delay, the write pulse 134 lines up with the clock signal 142.

What is claimed is:

1. A method for skewing a sub-clock cycle write pulse of a write enable signal relative to a corresponding address/data signal, comprising the steps of:

inputting a base clock signal to a reference first input of a phase-locked loop circuit and to a first register, the base clock signal defining a clock cycle;

inputting the address/data signal to the first register, the first register being clocked by the base clock signal and generating in response to the address/data signal a registered address/data signal input to a memory circuit;

generating a local clock signal output from the phase-locked loop circuit, the local clock signal coupled to a sample delay circuit and a subject circuit, the sample delay circuit introducing a first timing delay approximating a second timing delay introduced by the subject circuit;

feeding back an output of the sample delay circuit to a second input of the phase-locked loop circuit;

inputting a write enable signal to a second register, the second register being clocked by the local clock signal and generating in response to the write enable signal a registered write enable signal;

wherein the subject circuit receives the registered write enable signal and is clocked by the local clock signal to generate said sub-clock cycle write pulse which is skewed within a base clock signal period wherein said skewed write pulse is input to the memory circuit; and wherein the phase-locked loop circuit locks the base clock signal and fed back sample delay circuit output into phase forcing the local clock signal to have an active edge at an interval of time before an active edge of the base clock signal, the interval equaling the first timing delay plus a prescribed phase shift of at least zero degrees.

2. An apparatus for skewing a sub-clock cycle write pulse of a write enable signal relative to a corresponding address/data signal of a memory circuit, comprising:

a phase-locked loop circuit receiving a base clock signal at a first input and generating a phase-locked output signal;

a first register clocked by the base clock signal and receiving the address/data signal, which in response generates a registered address/data signal for the memory circuit;

a second register clocked by the phase-locked output signal and receiving the write enable signal, which in response generates a registered write enable signal;

a delay circuit receiving the phase-locked output signal, the delay circuit introducing a first timing delay and feeding back a delay signal to a second input of the phase-locked loop circuit;

a subject circuit receiving the phase-locked output signal and the registered write enable signal, and generating in response the skewed sub-clock cycle write pulse, the subject circuit introducing a second timing delay; and wherein the phase-locked loop circuit locks the base clock signal and fed back delay signal into phase forcing the phase-locked output signal to have an active signal edge at an interval of time before an active edge of the base clock signal, the interval equaling the first timing delay plus a prescribed phase shift of at least zero degrees; and wherein the skewed sub-clock cycle write pulse is skewed relative to the base clock signal by the prescribed phase shift.

3. The apparatus of claim 2, in which the first timing delay approximates the second timing delay.

4. A prescribed delay synchronous logic device receiving an input signal and a base clock signal and in response generating a device output signal having a prescribed phase relative to the base clock signal, comprising:

an unclocked combinatorial logic circuit receiving the input signal and generating in response a first output signal;

a phase-locked loop circuit receiving the base clock signal at a first input and generating a phase-locked output signal;

a register clocked by the phase-locked output signal receiving the first output signal, which in response generates a registered first output signal;

an output buffer receiving and storing the registered first output signal as the device output signal having the prescribed phase relative to the base clock signal, wherein the register and output buffer introduce a first timing delay to the first output signal from the combinatorial logic circuit;

a delay circuit receiving the phase-locked output signal, the delay circuit introducing a second timing delay and feeding back a delay signal to a second input of the phase-locked loop circuit;

wherein the phase-locked loop circuit locks the base clock signal and fed back delay signal into phase forcing the phase-locked output signal to have an active signal edge at an interval of time before an active edge of the base clock signal, the interval equaling the second timing delay plus the prescribed phase.

5. The device of claim 4, in which the prescribed phase is greater than zero.

* * * * *